(12) United States Patent
Forman et al.

(10) Patent No.: US 7,902,877 B1
(45) Date of Patent: Mar. 8, 2011

(54) DIGITAL SAMPLING MIXER WITH MULTIPHASE CLOCKS

(75) Inventors: Dustin D. Forman, Kelowna (CA); Andrew Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 12/683,182

(22) Filed: Jan. 6, 2010

Related U.S. Application Data

(63) Continuation of application No. PCT/US2010/020155, filed on Jan. 5, 2010.

(60) Provisional application No. 61/285,900, filed on Dec. 11, 2009.

(51) Int. Cl.
*H03K 19/00* (2006.01)

(52) U.S. Cl. .............................. 326/93; 326/96; 327/242

(58) Field of Classification Search .................... 326/93
See application file for complete search history.

(56) References Cited

U.S. PATENT DOCUMENTS

| | | | |
|---|---|---|---|
| 6,255,875 B1 * | 7/2001 | Gabara ...................... 327/201 |
| 2004/0130542 A1 * | 7/2004 | Tanada ........................ 345/204 |
| 2005/0168252 A1 * | 8/2005 | Kubota et al. ................. 327/154 |
| 2007/0222737 A1 * | 9/2007 | Kimura ........................ 345/100 |

* cited by examiner

*Primary Examiner* — Rexford N Barnie
*Assistant Examiner* — Jany Tran
(74) *Attorney, Agent, or Firm* — Kenta Suzue; Haynes Beffel & Wolfeld LLP

(57) ABSTRACT

A multiphase clock generates pulses at a rate much higher than the clock frequency.

16 Claims, 10 Drawing Sheets

DIGITAL SAMPLING MIXER WITH MULTIPHASE CLOCKS

REFERENCE TO RELATED APPLICATION

This application is a continuation of PCT Application No. PCT/US10/20155, filed 5 Jan. 2010 which claims the benefit of U.S. Provisional Application No. 61/285,900 filed 11 Dec. 2009, and this application claims the benefit of U.S. Provisional Application No. 61/285,900 filed 11 Dec. 2009, all of which are incorporated by reference herein.

BACKGROUND OF THE INVENTION

In a digital sampling mixer (DSM) samples of a signal are taken at high speed in order to down-convert what is typically a radio frequency (RF) signal to a lower, more manageable rate. Such sampling requires activation of switches at a rate higher than the RF signal itself. For example, in a TV tuner application the highest RF signal may be 1 GHz and the samples taken at 2.4 GHz or higher. Such a high speed clock is inconvenient and costly.

U.S. Pat. No. 7,028,070 relies on a delay line, the output of which activates a series of SHA (sample and hold amplifiers) in sequence. However, an imperfection arises due to the mismatch of delay time in the delay line. This mismatch, being random, executes a classic "random walk" around an ideal graph of sample time vs position in the sequence. Such a classic random walk exhibits a nominal (or expected) deviation of sqrt(N) where N is the length of the sequence. Therefore given a sequence of say 100 delay elements, each element having a delay of, for example 1 nanosecond, and further having a random deviation of say 100 picoseconds, the mean deviation from the ideal linear progression vs. time is sqrt(100)*100 picoseconds=1 nanosecond. But in practice the deviation is well over 10 nanoseconds. In an actual example, a chip with 320 picoseconds delay with 30 picoseconds deviation and 121 elements exhibits a 2 nanosecond deviation, well over the theoretical mean deviation of sqtr (121)*30 picoseconds=330 picoseconds.

The delay line does not exhibit the characteristic of a random walk. The error, the 100 picoseconds in the first example, is correlated along the sequence. For example, the first 50 delay elements are all 0.9 nanoseconds and the last 50 delay elements are all 1.1 nanoseconds. There is still 100 nanoseconds of total delay. However, although the mid point of the delay chain is expected to be at 50 nanoseconds, the mid point of the delay chain is in fact occurring at 0.9 nanoseconds*50=45 nanoseconds, or 5 nanoseconds away from the expected point. That is 5 times the value predicted by the expected random-walk.

SUMMARY OF THE INVENTION

Various embodiments relate to multiphase clock generates pulses at a rate much higher than the clock frequency.

One apparatus embodiment includes clock circuitry, a plurality of latches, and combinational logic:

clock circuitry generating a plurality of clock signals having an odd number of clock signals being three or more, the plurality of clock signals having a common frequency, and a phase delay corresponding to the odd number of clock signals evenly separating the first plurality of clock signals;

a plurality of latches connected in series, wherein adjacent latches of the series are connected such that an output of a preceding latch of the adjacent latches in the series is connected to an input of a following latch of the adjacent latches in the series, the plurality of latches being clocked by the plurality of clock signals and inverted versions of the plurality of clock signals such that half of the phase delay separates clock signals of the preceding latch and the following latch of the adjacent latches in the series;

combinational logic coupled to outputs of the plurality of latches, the combinational logic generating pulses at a rate of two times the odd number of clock signals times the common frequency of the plurality of clock signals.

In another embodiment, the apparatus is a digital sampling mixer, and the pulses control sample and hold circuitry of the digital sampling mixer.

In another embodiment, the pulses are overlapping.

In another embodiment, the pulses are non-overlapping.

Another apparatus embodiment includes clock circuitry, a plurality of latches, and combinational logic:

clock circuitry generating a plurality of clock signals having an even number of clock signals being four or more, the plurality of clock signals having a common frequency, and a phase delay corresponding to the even number of clock signals evenly separating the first plurality of clock signals;

a plurality of latches connected in series, wherein adjacent latches of the series are connected such that an output of a preceding latch of the adjacent latches in the series is connected to an input of a following latch of the adjacent latches in the series, the plurality of latches being clocked by the plurality of clock signals such that the phase delay separates clock signals of the preceding latch and the following latch of the adjacent latches in the series;

combinational logic coupled to outputs of the plurality of latches, the combinational logic generating pulses at a rate of the even number of clock signals times the common frequency of the plurality of clock signals.

In another embodiment, the apparatus is a digital sampling mixer, and the pulses control sample and hold circuitry of the digital sampling mixer.

In another embodiment, the pulses are overlapping.

In another embodiment, the pulses are non-overlapping.

Another aspect of the technology is a method with the following steps:

clocking series-connected latches, with a plurality of clock signals having an odd number of clock signals being three or more and with inverted versions of the clock signals, the plurality of clock signals having a common frequency, and a phase delay corresponding to the odd number of clock signals evenly separating the first plurality of clock signals; and generating pulses from the series-connected latches at a rate of two times the odd number of clock signals times the common frequency of the plurality of clock signals.

One embodiment further comprises:

clocking a digital sampling mixer with the pulses.

In one embodiment, the pulses are overlapping.

In one embodiment, the pulses are non-overlapping.

Another aspect of the technology is a method with the following steps:

clocking series-connected latches, with a plurality of clock signals having an even number of clock signals being four or more, the plurality of clock signals having a common frequency, and a phase delay corresponding to the even number of clock signals evenly separating the first plurality of clock signals; and generating pulses from the series-connected latches at a rate of two times the even number of clock signals times the common frequency of the plurality of clock signals.

One embodiment further comprises:

clocking a digital sampling mixer with the pulses.

In one embodiment, the pulses are overlapping.

In one embodiment, the pulses are non-overlapping.

DETAILED DESCRIPTION

Various embodiments use multiple copies of a lower frequency clock to activate switches at a rate much higher than the clock frequency.

Figure 11:
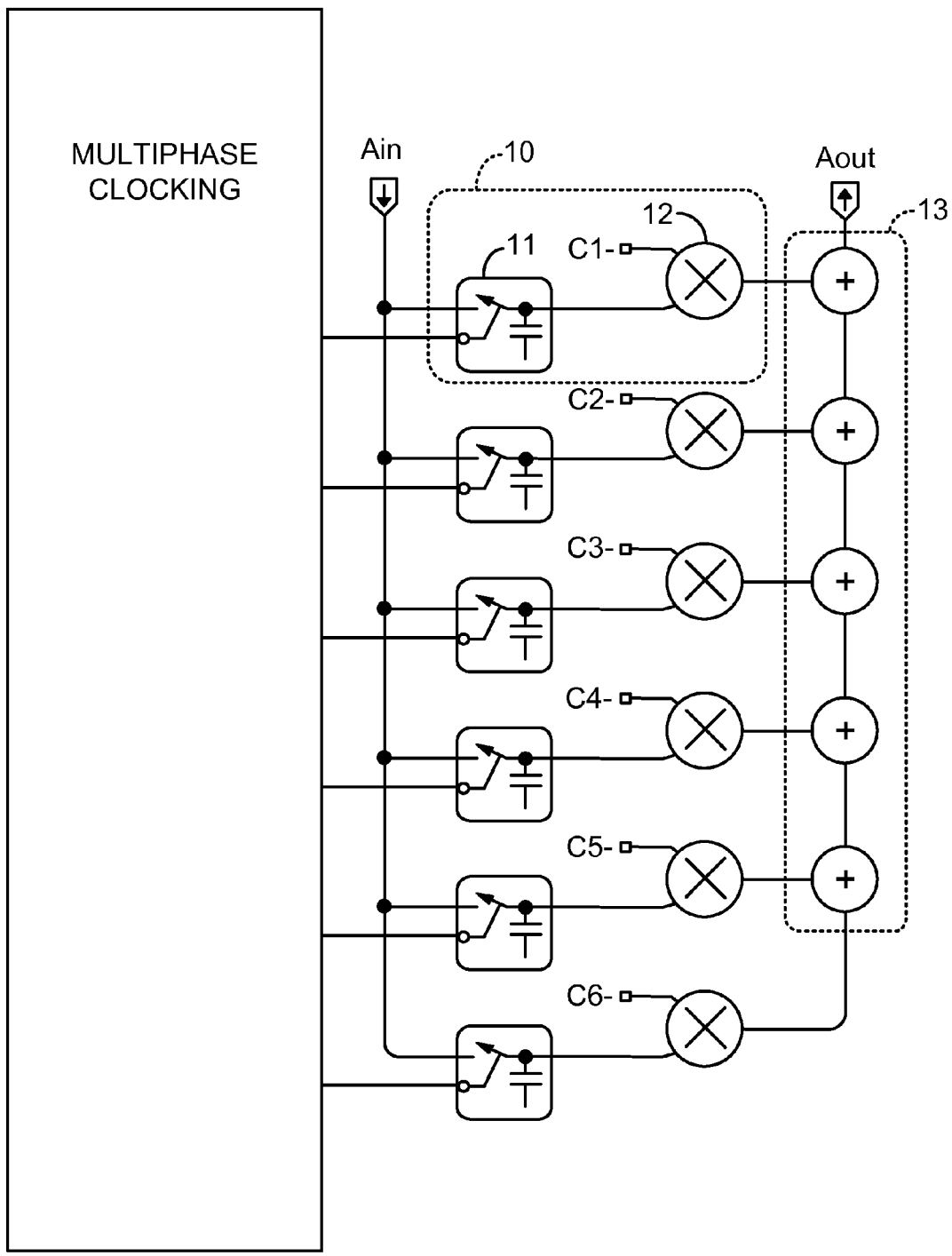
FIG. 11 is a block diagram of a digital sampling mixer with the improved multiphase clock circuit.

An example of a digital sampling mixer is discussed in U.S. Pat. No. 7,028,070, incorporated by reference herein. FIG. 11 shows a modified version of such a digital sampling mixer. A chain of gates (14) is the timing element that activates the sample and hold (SHA) circuits (11).

In the present technology, with a chain of latches, a signal propagates down the chain at a rate higher than the clock frequency of the clocks. If adjacent devices are gated together, a precisely timed series of pulses with time separations less than that of the clock is generated. A 'latch' is an electronic element with state. The state of the latch persists indefinitely if a certain control input is, for example, high, and copies an externally applied state if the control input is, for example, low.

Figure 1:
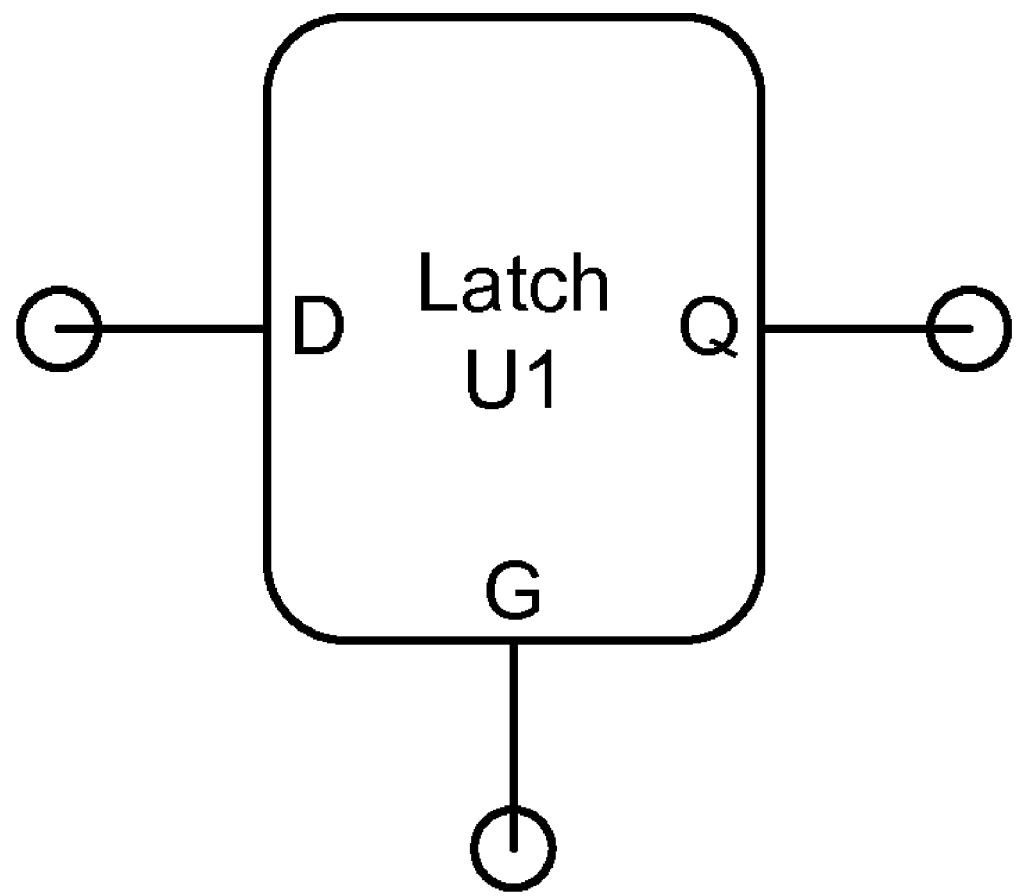
FIG. 1 is a block diagram of a latch.

An example latch element is shown in FIG. 1. If 'G' is high, the output state 'Q' copies that of the input state 'D'. If 'G' is low, then the output state remains as it last was just prior to the 'G' input going low.

Figure 2:
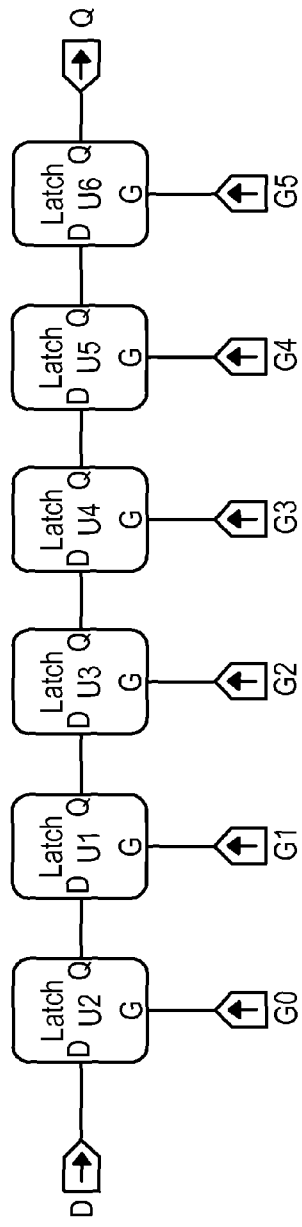
FIG. 2 is a block diagram of a chain of latches.

A chain of latches is created by connecting 'Q' to 'D' as shown in FIG. 2:

A model demonstrates the operation of clocking a DSM with a multi-phase clock. The model of the latch is:

AQ Q 0 v=if V(G)>0 then
if V(D)>0 then 1 else –1
else
if V(Q)>0 then 1 else –1

Example with Three Clock Phases and Non-Overlapping Outputs

Figure 3:
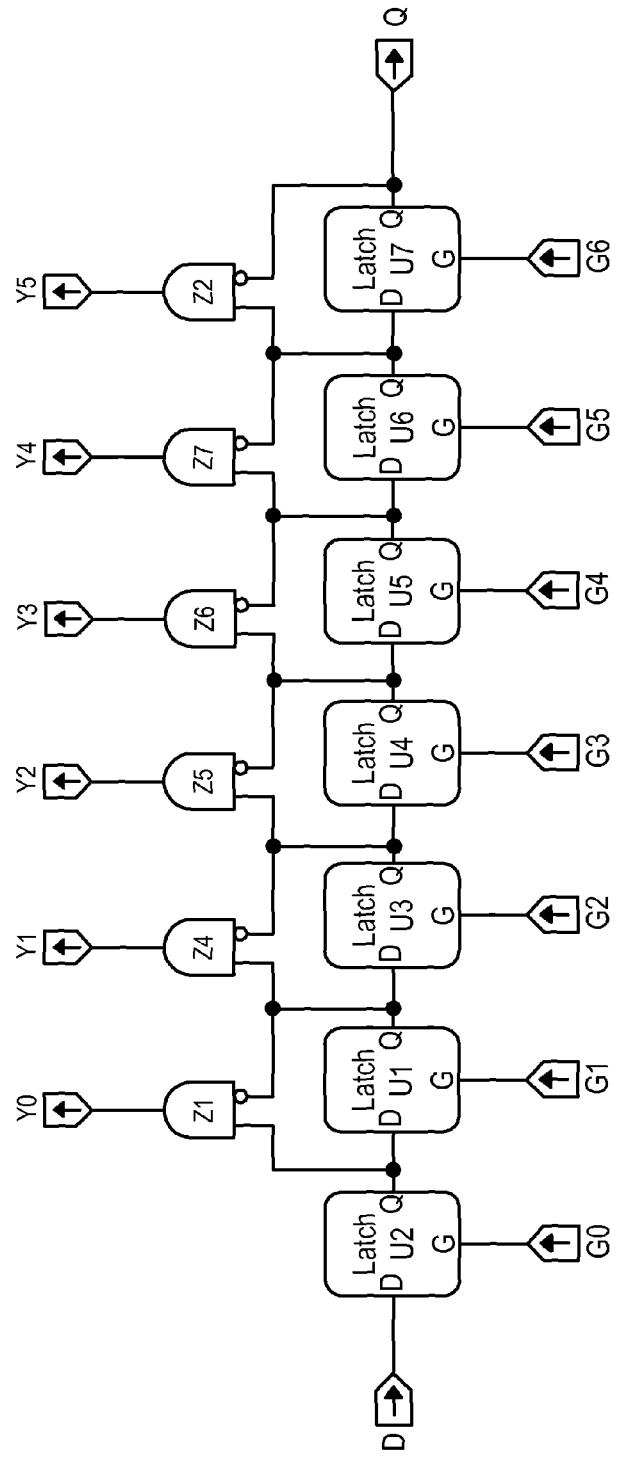
FIG. 3 is a block diagram of a chain of latches with gates added to the latch outputs to generate non-overlapping pulses.

An embodiment further includes gates added to the Q outputs, as shown in FIG. 3.

A multi-phase clock is defined by these statements:
.param fa=500 meg aa=1.0
VA A 0 'aa*sin(0)' sin(0 aa fa 0 0 0)
VB B 0 'aa*sin(2/3*pi)' sin(0 aa fa 0 0 120)
VC C 0 'aa*sin(4/3*pi)' sin(0 aa fa 0 0 240)
EG0 G0 0 A 0 1
EG1 G1 0 B 0 –1
EG2 G2 0 C 0 1
EG3 G3 0 A 0 –1
EG4 G4 0 B 0 1
EG5 G5 0 C 0 –1
EG6 G6 0 A 0 1

Figure 4:
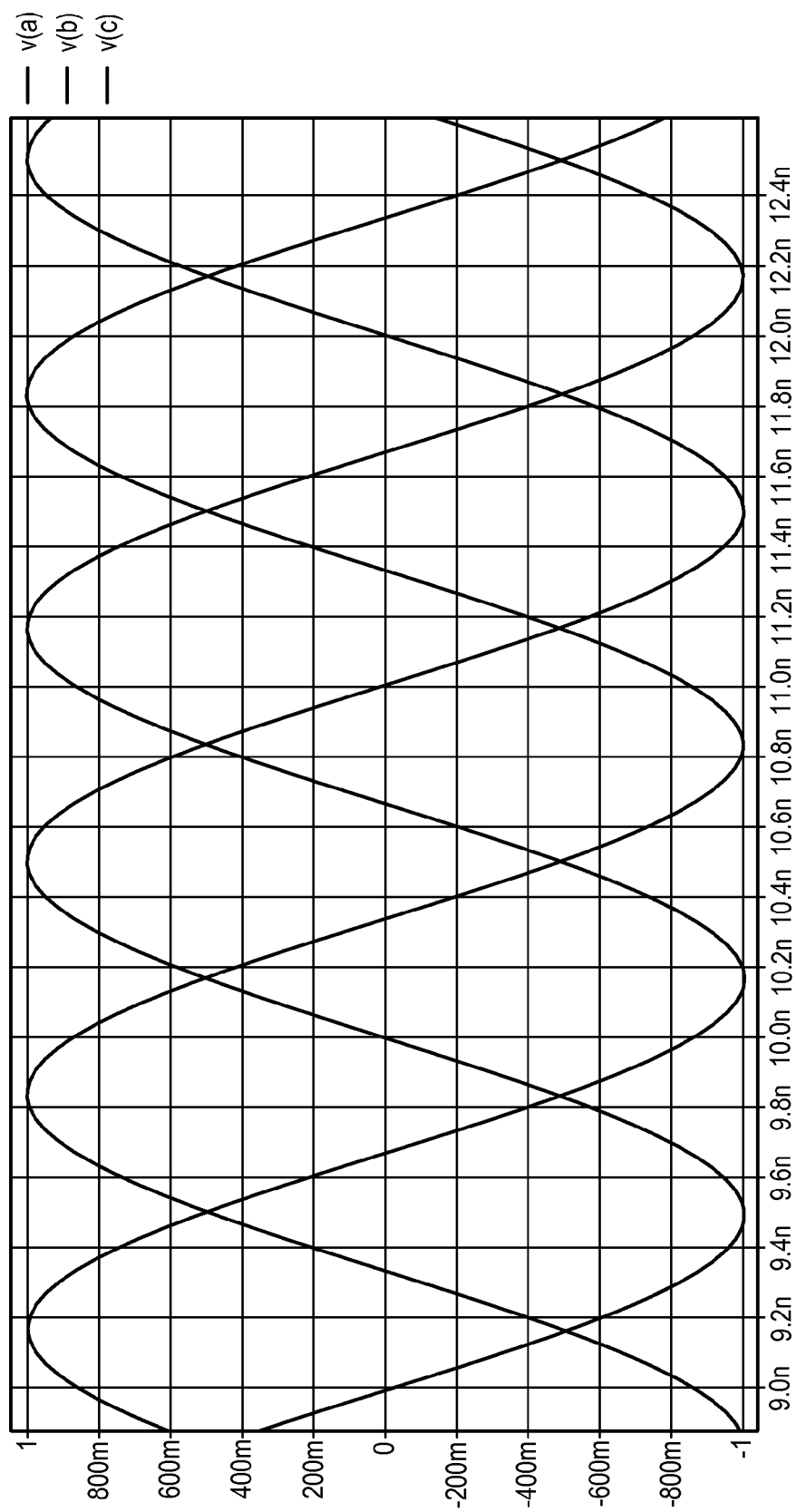
FIG. 4 is a graph of a three phase clock used to clock the chain of latches.
Figure 5:
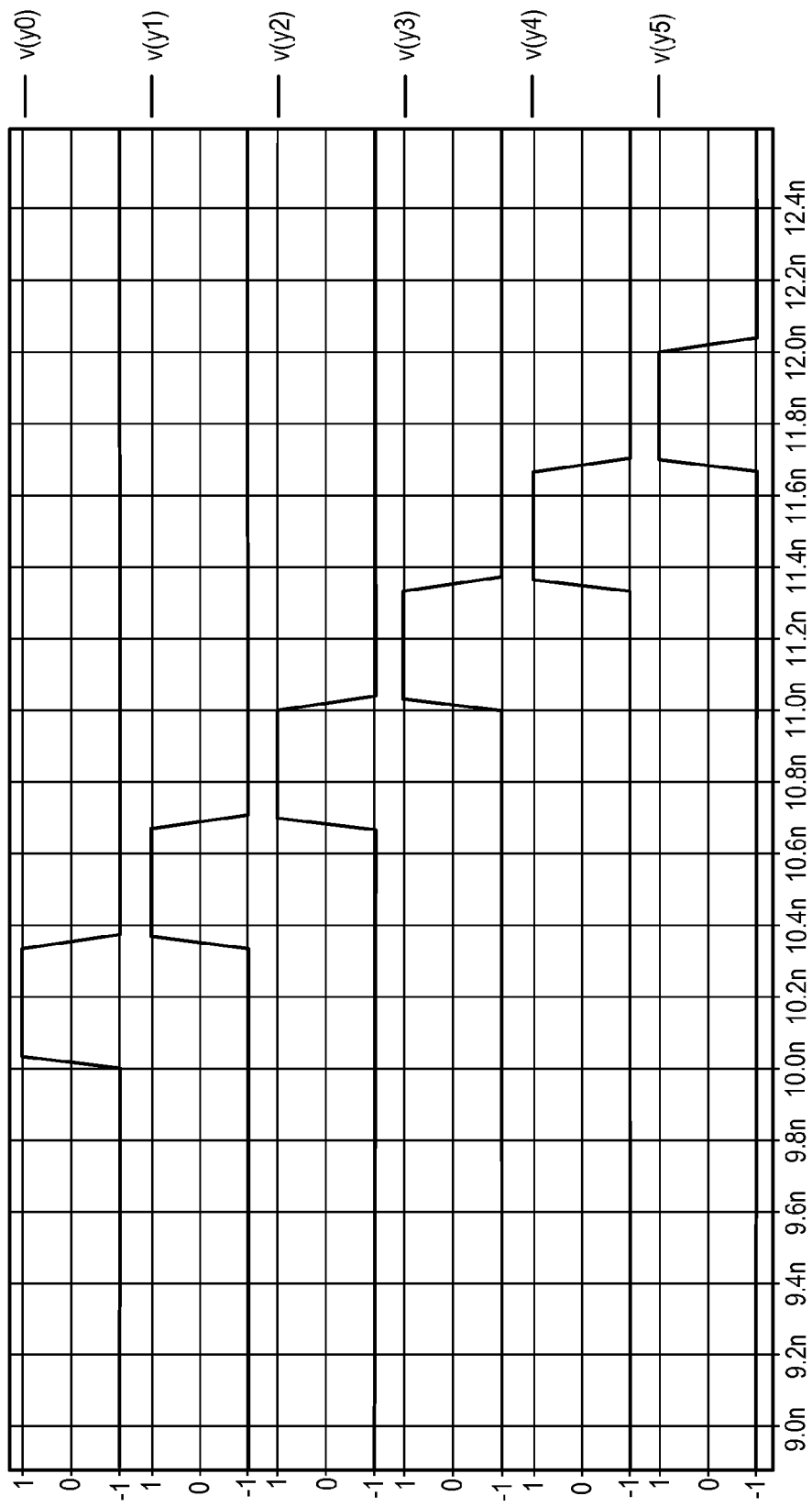
FIG. 5 is a graph of the non-overlapping pulses output from the chain of latches, such as the one of FIG. 4.

A,B,C are a three phase clock with 120° phase difference as shown in FIG. 4. The clocks are connected in the sequence A, –B, C, –A, B, –C, etc where the minus sign indicates inversion. A signal falls through the latches at a rate of six times the clock as shown in FIG. 5. Six non-overlapping pulses are generated for one cycle of the clock.

The advantage of the non-overlapping output version is that one sampling capacitor is connected at any one time. Consequently the load seen by the driving circuit is low, as it only every needs to drive one switch and capacitor.

In other embodiments, any odd number of clock phases is used. Other embodiments generate overlapping output pulses of any desired width.

Example with Three Clock Phases and Overlapping Outputs

Figure 6:
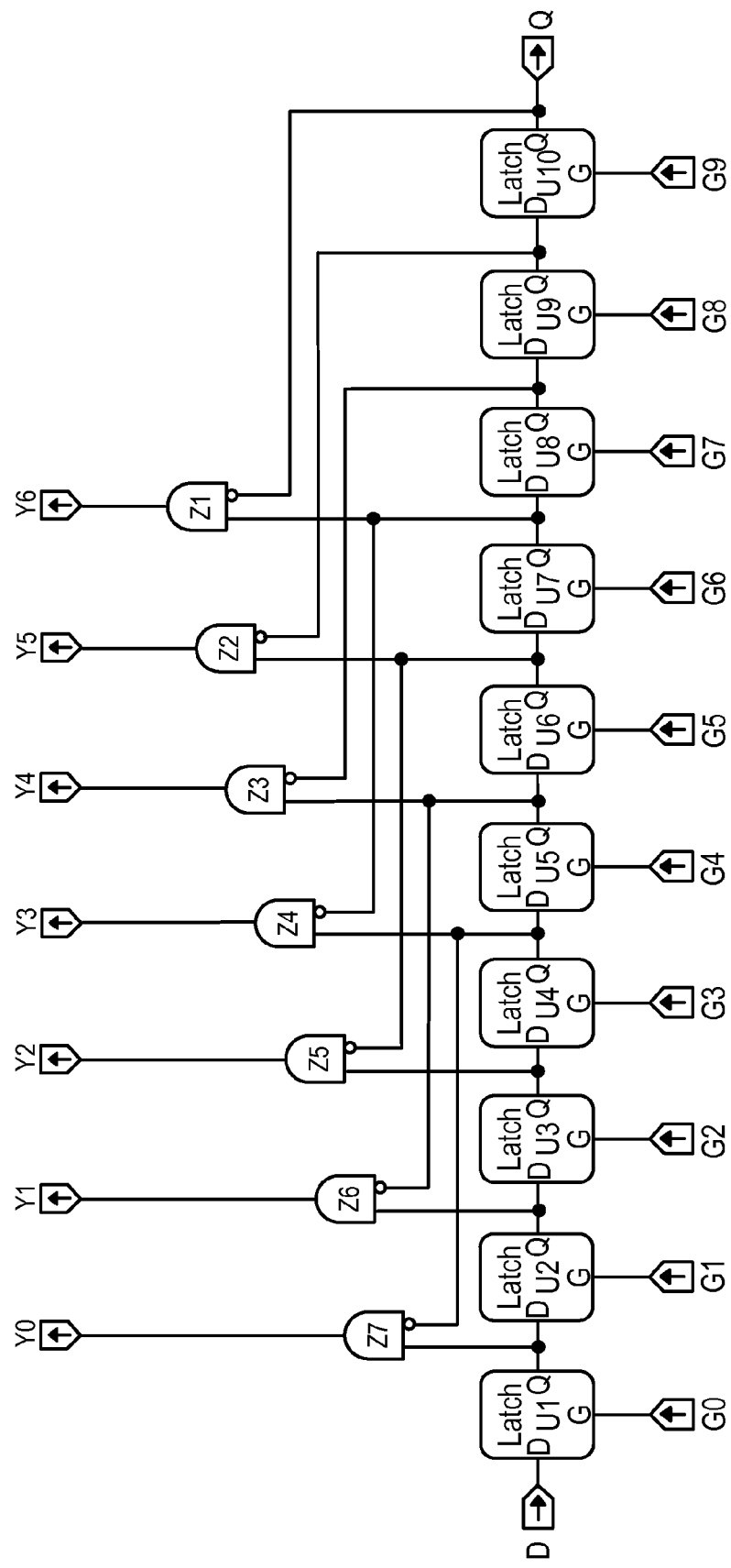
FIG. 6 is a block diagram of a chain of latches with gates added to the latch outputs to generate overlapping pulses.
Figure 7:
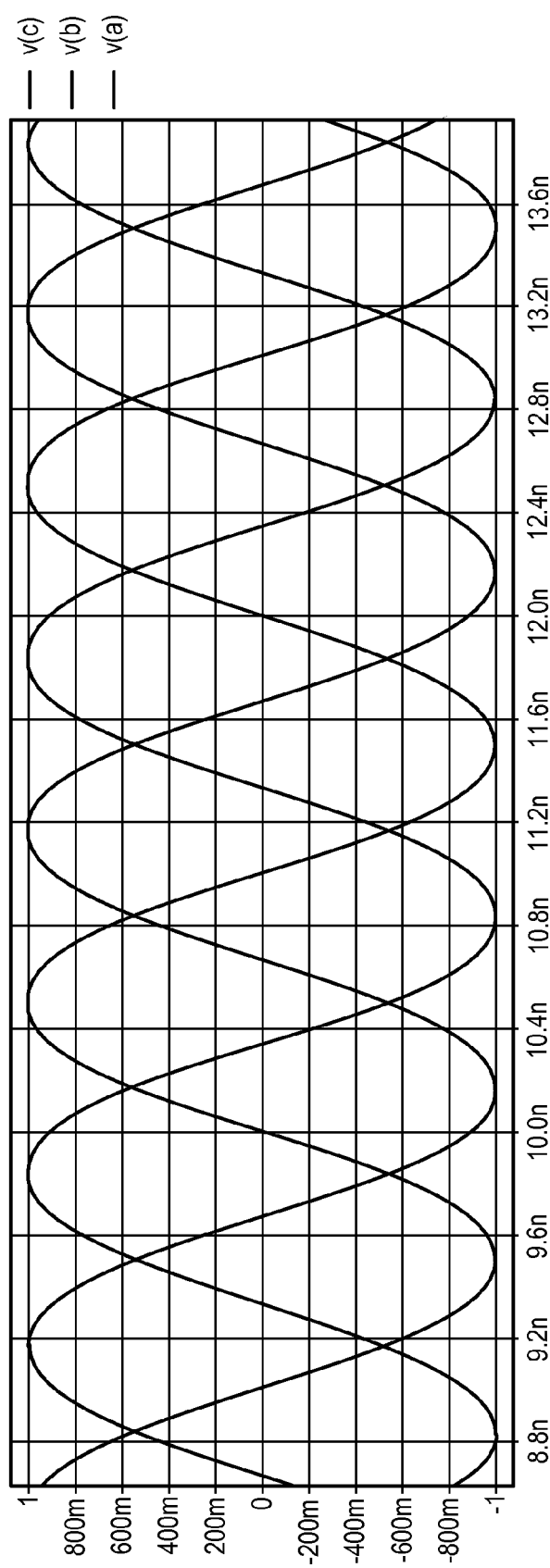
FIG. 7 is a graph of a three phase clock used to clock the chain of latches.
Figure 8:
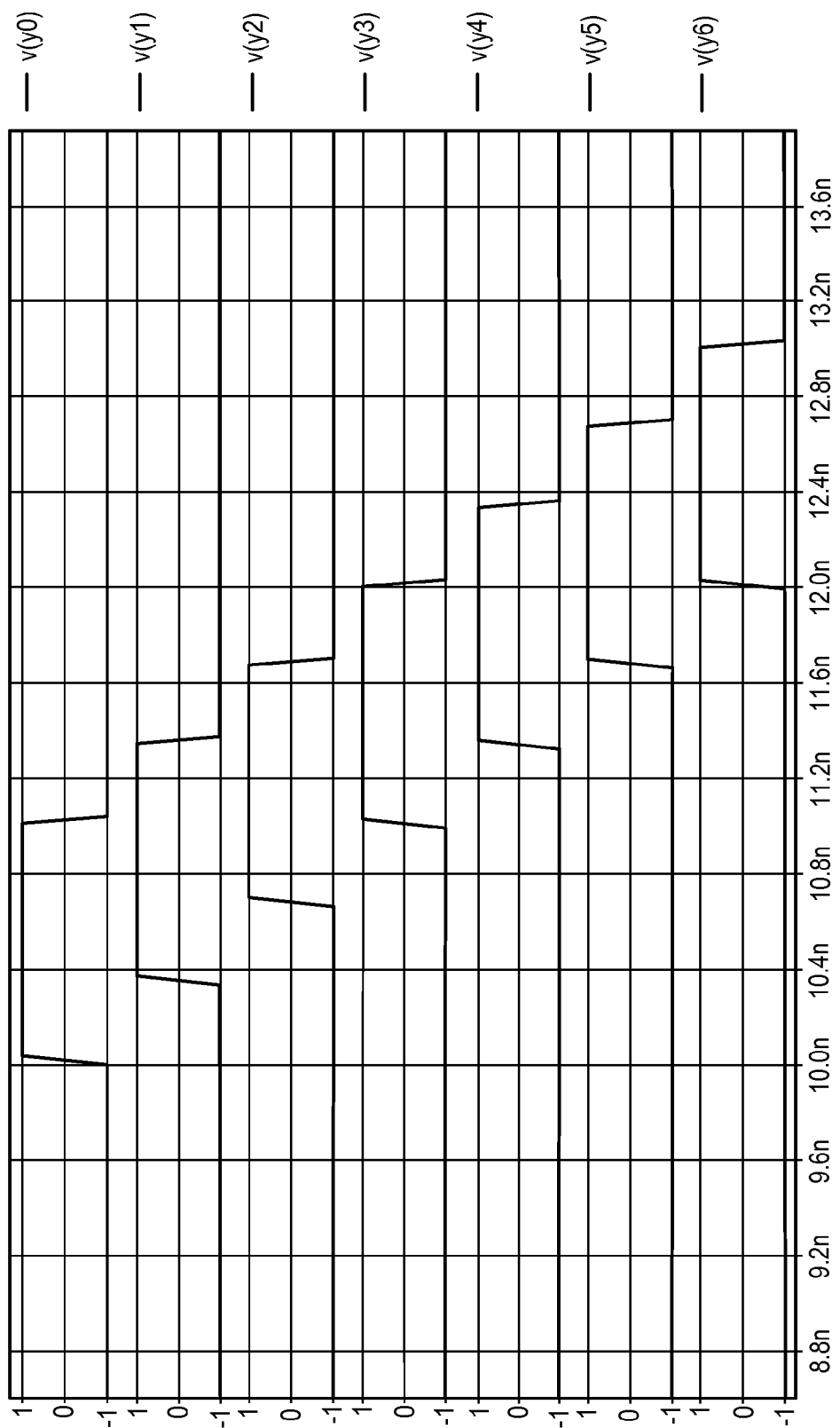
FIG. 8 is a graph of the overlapping pulses output from the chain of latches, such as the one of FIG. 6.

In FIG. 6, the circuit gates are modified to "leap over" the latches. Any degree of overlapping pulses can be created:

A,B,C are a three phase clock with 120° phase difference as shown again in FIG. 7. In FIG. 8, six overlapping pulses are generated for one cycle of the clock.

The advantage of overlapping output is as follows. In an example, the SHA is a switch that turns on for nominally 1 nanosecond and then goes off, while at the same time the next switch comes on. The mathematical instant of sampling is, to a first order, the time when the switch turns off. At that time the charge is trapped and the sample has been taken. There is a second order effect. The on resistance of the switch and the value of the capacitor make a finite bandwidth, and this bandwidth limits the rate-of-change of the signal. Suppose the SHA has been at –1 volt and now must go to +1 v. If the switch opens for 1 nanosecond the RC of the switch and capacitor may not be fast enough, the signal may be truncated by the switch going off, when the signal is part way up the exponential rise. Since only the moment of turning off the switch matters from the sample point of view, the switch can be allowed to stay on longer. But the rate of switch operation is maintained, rather than slowing down the whole circuit. So the solution is overlapping pulses. However, the driving device now sees more than one capacitor connected at any time and this presents a higher, more difficult to drive, load.

Example with Five Clock Phases and Overlapping Outputs

The previous circuit has modified clocks as follows:
.param fa=500 meg aa=1.0
VA A 0 'aa*sin(0)' sin(0 aa fa 0 0 0)
VB B 0 'aa*sin(2/5*pi)' sin(0 aa fa 0 0 72)

```
VC C 0 'aa*sin(4/5*pi)' sin(0 aa fa 0 0 144)
VD D 0 'aa*sin(6/5*pi)' sin(0 aa fa 0 0 216)
VE E 0 'aa*sin(8/5*pi)' sin(0 aa fa 0 0 288)
EG0 G0 0 A 0 1
EG1 G1 0 C 0 -1
EG2 G2 0 E 0 1
EG3 G3 0 B 0 -1
EG4 G4 0 D 0 1
EG5 G5 0 A 0 -1
EG6 G6 0 C 0 1
EG7 G7 0 E 0 -1
EG8 G8 0 B 0 1
EG9 G9 0 D 0 -1
```

Figure 9:
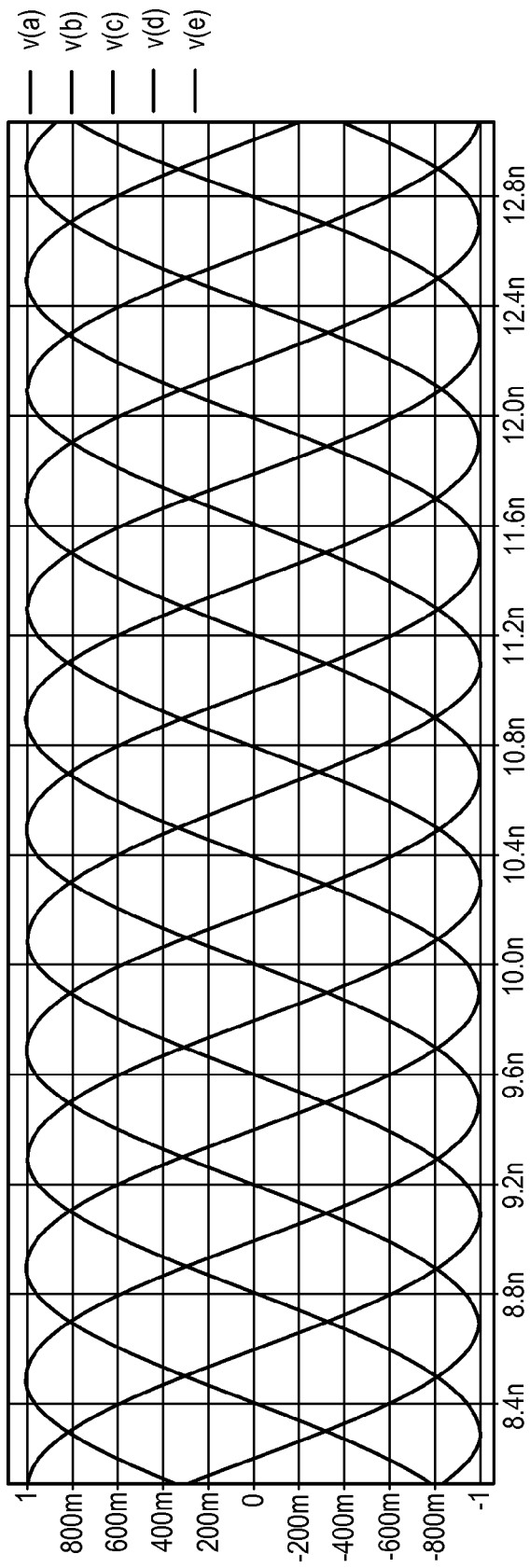
FIG. 9 is a graph of a five phase clock used to clock the chain of latches.
Figure 10:
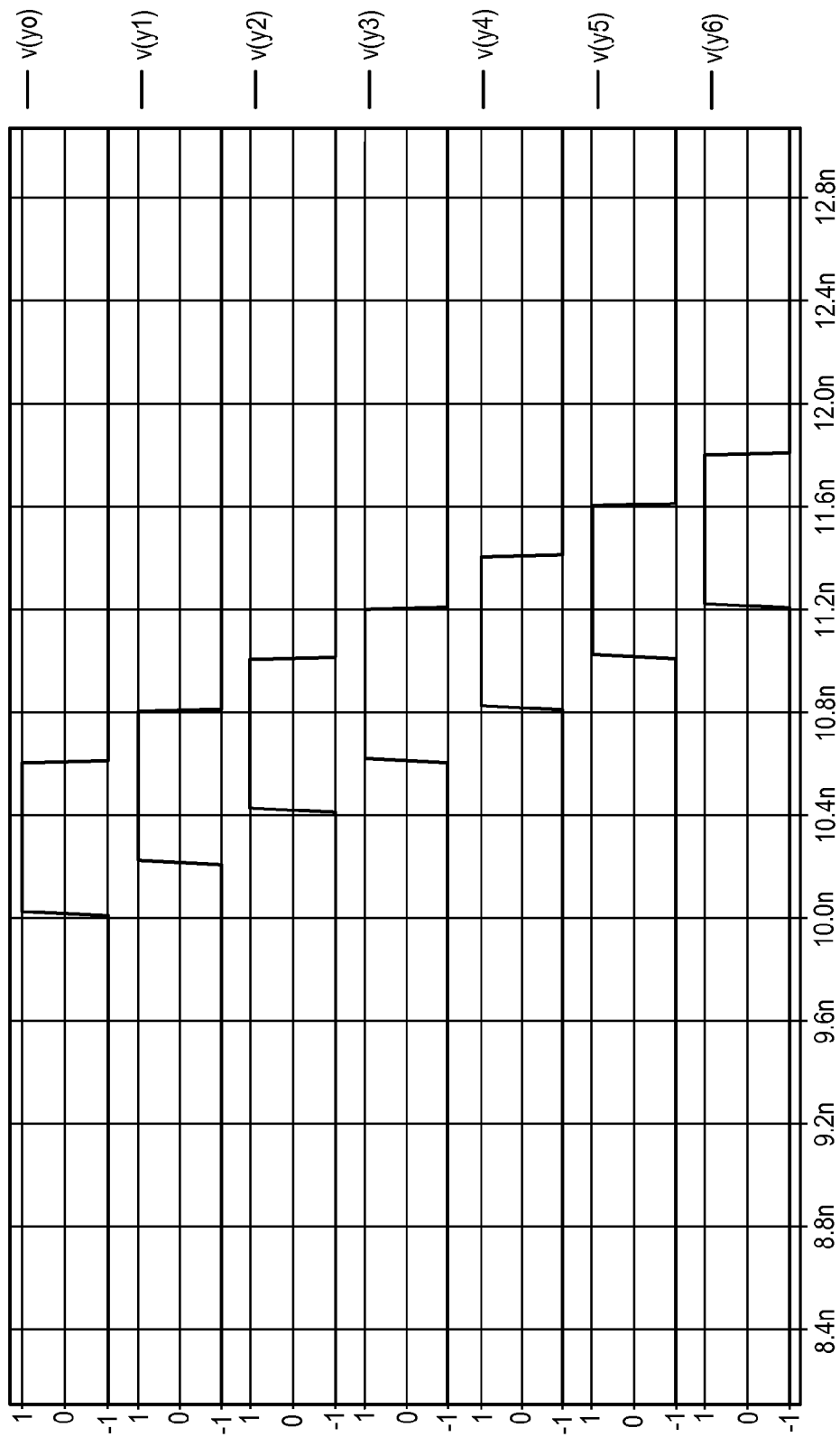
FIG. 10 is a graph of the overlapping pulses output from the chain of latches, resulting from the five phase clock such as the one of FIG. 9.

A,B,C,D,E are a five phase clock with 72° phase difference as shown in FIG. 9. Ten overlapping pulses are generated for one cycle of the clock. FIG. 10 shows only seven, but the fact that ten occur in one cycle is evident. One cycle is 2 nanoseconds. In between the time indexes 10.0 nanoseconds and 11.2 nanoseconds, the leading edges of pulses occur, or 1 pulse leading edge every 0.2 nanoseconds. So (2 nanseconds/cycle)* (1 pulse leading edge/0.2 nanoseconds)=(10 pulse leading edges/cycle).

FIG. 11 shows an example digital sampling mixer with the present multiphase clocking technology.

CONCLUSION

Sampling pulses suitable to activate the sample and hold of a digital sampling mixer are generated for every phase of a multiphase clock. This is effective for odd numbers of phases where two times the number of phases of pulses occur in one cycle. The pulses are generated by a chain of latches, each connected to an appropriate phase of the clock, such that the data "falls through" on every phase rotation. A gate is connected to detect the position of the changing data as it passes down the chain, described as follows.

When the "wave" of 1's (or 0's) passing down the chain has reached any given position, the output the output will be '1' (or '0'). Further down the chain is still '0' (or '1') since the 'wave' has not reached there yet. Therefore, the detection of a '1' (or '0') at the local position in conjunction with a '0' (or '1') at the next adjacent position indices that a pulse is required now. The gate therefore is an AND gate with one input inverted (i.e. it creates a '1' when the input is "10". Conversely, another embodiment uses the negative edge and searches for a 0 locally and a 1 remaining at the next adjacent position. If the test is applied not at the immediately adjacent position then an overlapping pulse results.

The gate output activates the sample and hold. The gate outputs may be single pulses or overlapping pulses depending on whether the gate inputs are adjacent or not.

We claim:

1. An apparatus, comprising:
    clock circuitry generating a plurality of clock signals having an odd number of clock signals being three or more, the plurality of clock signals having a common frequency, and a phase delay corresponding to the odd number of clock signals evenly separating the first plurality of clock signals;
    a plurality of latches connected in series, wherein adjacent latches of the series are connected such that an output of a preceding latch of the adjacent latches in the series is connected to an input of a following latch of the adjacent latches in the series, the plurality of latches being clocked by the plurality of clock signals and inverted versions of the plurality of clock signals such that half of the phase delay separates clock signals of the preceding latch and the following latch of the adjacent latches in the series;
    combinational logic coupled to outputs of the plurality of latches, the combinational logic generating pulses at a rate of two times the odd number of clock signals times the common frequency of the plurality of clock signals.

2. The apparatus of claim 1, wherein the apparatus is a digital sampling mixer, and the pulses control sample and hold circuitry of the digital sampling mixer.

3. The apparatus of claim 1, wherein the pulses are overlapping.

4. The apparatus of claim 1, wherein the pulses are non-overlapping.

5. A method, comprising:
    clocking series-connected latches, with a plurality of clock signals having an odd number of clock signals being three or more and with inverted versions of the clock signals, the plurality of clock signals having a common frequency, and a phase delay corresponding to the odd number of clock signals evenly separating the first plurality of clock signals; and
    generating pulses from the series-connected latches at a rate of two times the odd number of clock signals times the common frequency of the plurality of clock signals.

6. The method of claim 5, further comprising:
    clocking a digital sampling mixer with the pulses.

7. The method of claim 5, wherein the pulses are overlapping.

8. The method of claim 5, wherein the pulses are non-overlapping.

9. An apparatus, comprising:
    clock circuitry generating a plurality of clock signals having an even number of clock signals being four or more, the plurality of clock signals having a common frequency, and a phase delay corresponding to the even number of clock signals evenly separating the first plurality of clock signals;
    a plurality of latches connected in series, wherein adjacent latches of the series are connected such that an output of a preceding latch of the adjacent latches in the series is connected to an input of a following latch of the adjacent latches in the series, the plurality of latches being clocked by the plurality of clock signals such that the phase delay separates clock signals of the preceding latch and the following latch of the adjacent latches in the series;
    combinational logic coupled to outputs of the plurality of latches, the combinational logic generating pulses at a rate of the even number of clock signals times the common frequency of the plurality of clock signals.

10. The apparatus of claim 9, wherein the apparatus is a digital sampling mixer, and the pulses control sample and hold circuitry of the digital sampling mixer.

11. The apparatus of claim 9, wherein the pulses are overlapping.

12. The apparatus of claim 9, wherein the pulses are non-overlapping.

13. A method, comprising:
    clocking series-connected latches, with a plurality of clock signals having an even number of clock signals being four or more, the plurality of clock signals having a common frequency, and a phase delay corresponding to the even number of clock signals evenly separating the first plurality of clock signals; and generating pulses from the series-connected latches at a rate of two times the even number of clock signals times the common frequency of the plurality of clock signals.

14. The method of claim 13, further comprising:

clocking a digital sampling mixer with the pulses.

15. The method of claim 13, wherein the pulses are overlapping.

16. The method of claim 13, wherein the pulses are non-overlapping.

* * * * *